(12) United States Patent
Ou et al.

(10) Patent No.: US 7,132,695 B2
(45) Date of Patent: Nov. 7, 2006

(54) LIGHT EMITTING DIODE HAVING A DUAL DOPANT CONTACT LAYER

(75) Inventors: Chen Ou, Hsin-Chu (TW); Jia-Rong Chang, Hsin-Chu (TW); Chen-Ke Hsu, Hsin-Chu (TW); Chang-Huei Jing, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 10/605,513

(22) Filed: Oct. 5, 2003

(65) Prior Publication Data

US 2004/0104399 A1 Jun. 3, 2004

(30) Foreign Application Priority Data

Oct. 16, 2002 (TW) ................... 91124272

(51) Int. Cl.
*H10L 31/0304* (2006.01)

(52) U.S. Cl. .................................... 257/103
(58) Field of Classification Search .......... 257/79–103; 372/43–50
See application file for complete search history.

(56) References Cited

U.S. PATENT DOCUMENTS

| | | | | |
|---|---|---|---|---|
| 5,925,897 | A * | 7/1999 | Oberman | 257/80 |
| 5,981,977 | A * | 11/1999 | Furukawa et al. | 257/94 |
| 6,207,972 | B1 * | 3/2001 | Chen et al. | 257/94 |
| 6,515,308 | B1 * | 2/2003 | Kneissl et al. | 257/86 |
| 6,554,896 | B1 * | 4/2003 | Asai et al. | 117/89 |
| 6,586,777 | B1 * | 7/2003 | Yuasa et al. | 257/103 |
| 6,657,234 | B1 * | 12/2003 | Tanizawa | 257/79 |
| 6,657,300 | B1 * | 12/2003 | Goetz et al. | 257/745 |
| 2001/0038656 | A1 * | 11/2001 | Takeuchi et al. | 372/45 |
| 2002/0008245 | A1 * | 1/2002 | Goetz et al. | 257/87 |
| 2002/0053679 | A1 * | 5/2002 | Nikolaev et al. | 257/103 |
| 2002/0093020 | A1 * | 7/2002 | Edmond et al. | 257/79 |
| 2002/0117681 | A1 * | 8/2002 | Weeks et al. | 257/106 |
| 2002/0121646 | A1 * | 9/2002 | Khare et al. | 257/103 |
| 2002/0142563 | A1 * | 10/2002 | Sakai et al. | 438/410 |
| 2003/0183827 | A1 * | 10/2003 | Kawaguchi et al. | 257/79 |
| 2003/0201460 | A1 * | 10/2003 | Seaford et al. | 257/197 |

FOREIGN PATENT DOCUMENTS

| | | |
|---|---|---|
| JP | 2000-36616 | 2/2000 |
| JP | 2002-134416 | 5/2002 |

OTHER PUBLICATIONS

Merriam-Webster Collegiate Dictionary, Merriam-Webster Inc., Springfield, MA (USA) (1999) 10th Ed., p. 210.*
Wong et al, "Continuous-wave InGaN MQW Laser Diodes on Copper and Diamond Substrates (Forum Nitride Lasers)", Compound Semiconductor Magazine, Mar. 2001 (3 pages).*
M. Fukuda, "Optical Semiconductor Devices", John Wiley & Sons, New York (1999), p. 12.*

(Continued)

*Primary Examiner*—Jack Keith
*Assistant Examiner*—Ari M. Diacou
(74) *Attorney, Agent, or Firm*—Winston Hsu

(57) ABSTRACT

A light emitting diode with a dual dopant contact layer. The light emitting diode includes a substrate, a light emitting stacked structure formed on the substrate, a dual dopant contact layer formed on the light emitting stacked structure, and a transparent conductive oxide layer formed on the dual dopant contact layer. The dual dopant contact layer has a plurality of p-type dopants and a plurality of n-type dopants after being fabricated.

26 Claims, 2 Drawing Sheets

OTHER PUBLICATIONS

O. Madelung, "Semiconductors—Basic Data", Springer Verlag, Berlin (1996), p. 90.*

M. Fukuda "Optical Semiconductor Devices" John Wiley & Sons, New York 1999, pp. 82-85.*

* cited by examiner

LIGHT EMITTING DIODE HAVING A DUAL DOPANT CONTACT LAYER

BACKGROUND OF INVENTION

1. Field of the Invention

The present invention relates to a light emitting diode (LED). In particular, the present invention discloses an LED having a dual dopant contact layer.

2. Description of the Prior Art

The light emitting diode (LED) has been widely used in various fields. For example, the light emitting diodes are capable of being installed on optical display devices, traffic lights, data storage devices, communication devices, illuminative equipment, and medical equipment. Currently, an important issue for those skilled in the art is to improve electric characteristics and brightness of the LED. An LED structure with a thin nickel-gold (Ni/Au) transparent metallic layer forming on a p-type contact layer has been disclosed in the U.S. Pat. No. 5,563,422 for increasing light emitted from the LED. However, the transparent metallic layer made of the above-mentioned metallic materials merely has transmittance in the range of 60%~70%. It not only affects light emitting efficiency of the LED, but also cannot provide a good current spreading effect because of its thickness being usually about 10 nm.

In order to solve the above-mentioned problem, an LED with a transparent conductive oxide layer formed on a p-type contact layer having high carrier concentration has been disclosed in U.S. Pat. No. 6,078,064. Because the transparent conductive oxide layer has high transmittance, the transparent conductive oxide layer can be thicker to better spread current in the transparent conductive oxide layer. Therefore, brightness of the LED can be increased by improving light-emitting characteristic of the LED. However, the carrier concentration of the p-type contact layer needs to be greater than $5*10^{18}$ cm$^{-3}$ to form a good ohmic contact upon the transparent conductive oxide layer. With regard to the conventional semiconductor process, the p-type contact layer having high carrier concentration, however, is not easy to manufacture. It is well-known that the p-doped layer generally contains more defects, and the hydrogen atoms will affect formation of the p-doped layer. The carriers with high concentration are not easy to obtain even if a large amount of p-type dopants are implanted. Though this art can effectively increase light intensity of the light emitted from the LED, contact resistance between the p-type contact layer and the transparent conductive oxide layer is so high that the forward bias voltage of the LED can adversely affect electric characteristics of the LED.

An n+ reverse tunneling contact layer has been disclosed in Taiwan Pat. No. 144415 assigned to the same assignee as the present invention. The n+ reverse tunneling contact layer is positioned between a transparent electrode layer and a semiconductor light emitting layer, and a tunneling mechanism is utilized to form an ohmic contact associated with the transparent electrode layer and the semiconductor light emitting layer. The n+ reverse tunneling contact layer, unlike the above-mentioned p-type contact layer, having high carrier concentration is utilized to reduce difficulty in manufacturing the LED. However, the n+ reverse tunneling contact layer is sensitive to its thickness and concentration of the n-type carriers. When the concentration of the n-type carriers is too low, or the n+ reverse tunneling contact layer is too thick, the tunneling mechanism is blocked. Therefore, the formation of the n+ reverse tunneling contact layer needs to be strictly controlled.

SUMMARY OF INVENTION

Therefore, it is an object of the invention to provide a light emitting diode (LED) with a dual dopant contact layer, wherein the contact layer is not required to provide high carrier concentration.

Briefly summarized, the first preferred embodiment of the present invention discloses a light emitting diode (LED) comprising an insulating substrate, a buffer layer formed on the insulating substrate, an n-type contact layer formed on the buffer layer, a multiple quantum well light emitting layer formed on the first upper surface, a p-type contact layer formed on the multiple quantum well light emitting layer, a dual dopant contact layer formed on the p-type contact layer, a transparent conductive oxide layer formed on the dual dopant contact layer, a p-type electrode formed on the transparent conductive oxide layer, and an n-type electrode formed on the second upper surface.

In addition, the second preferred embodiment of the present invention discloses a light emitting device (LED) comprising an n-type electrode, an n-type conductive substrate formed on the n-type electrode, a buffer layer formed on the n-type conductive substrate, an n-type contact layer formed on the buffer layer, a multiple quantum well light emitting layer formed on the n-type contact layer, a p-type cladding layer formed on the multiple quantum well light emitting layer, a p-type contact layer formed on the p-type cladding layer, a dual dopant contact layer formed on the p-type contact layer, a transparent conductive oxide layer formed on the dual dopant contact layer, and a p-type electrode formed on the transparent conductive oxide layer.

It is an advantage of the present invention that a dual dopant contact layer is positioned between a transparent conductive oxide layer and the stacked semiconductor layers of the novel LED. With the p-type impurity and the n-type impurity coexist in the dual dopant layer, the resistance associated with the ohmic contact between the transparent conductive oxide layer and the stacked semiconductor layers of the LED is reduced. The dual dopant layer has a p-type impurity and an n-type impurity, as well as a corresponding p-type impurity energy level and a corresponding n-type impurity energy level coexist in the energy bandgap of the dual dopant contact layer. When the LED is powered by a normal operating forward bias, the energy band of the dual dopant contact layer is strongly bended. The conductive carriers are transmitted between the transparent conductive oxide layer and p-type contact layer through the coexist p-type and n-type impurity energy levels for forming a good ohmic contact when the novel LED is powered by a forward bias voltage. To sum up, the novel LED is capable of greatly increasing intensity of the emitted light without seriously making the forward bias voltage raised.

These and other objects of the present invention will no doubt become obvious to those of ordinary skill in the art after reading the following detailed description of the preferred embodiments, which are illustrated in the various figures and drawings.

DETAILED DESCRIPTION

Figure 1:
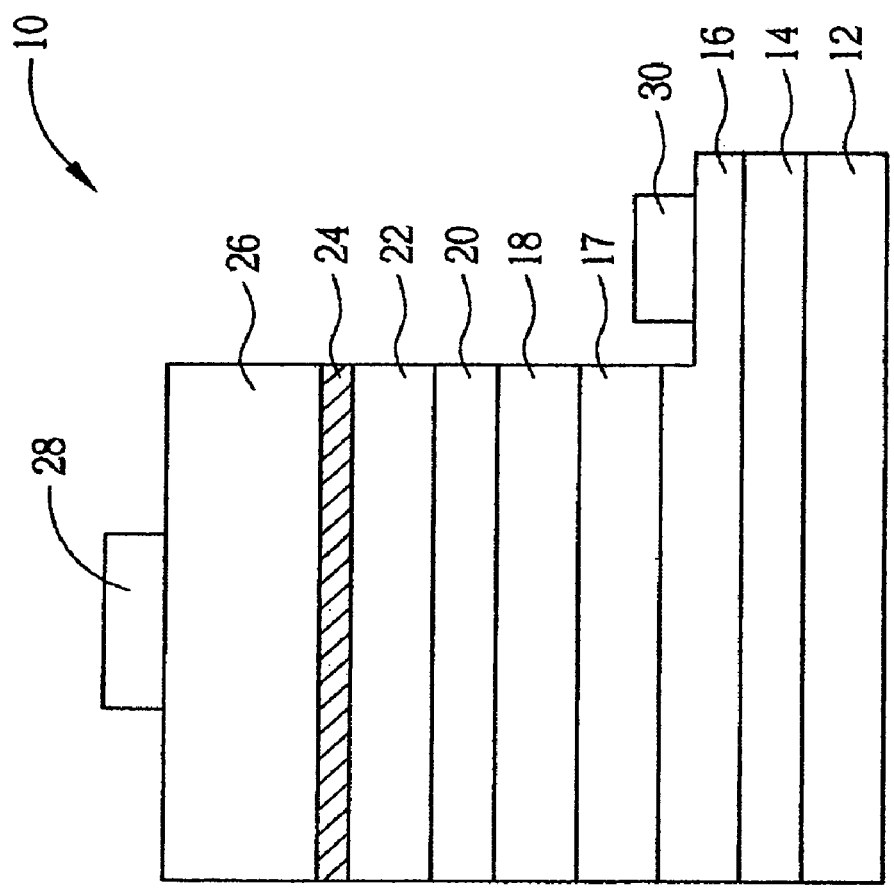
FIG. 1 is a structure diagram illustrating a light emitting diode according to a first embodiment of the present invention.

Please refer to FIG. 1, which is a structure diagram illustrating a light emitting diode 10 in accordance with a first embodiment of the present invention. The wavelength associated with light emitted from the LED 10 is 468 nm. The LED 10 has an insulating substrate 12 made of sapphire ($Al_2O_3$), a buffer layer 14 formed on the insulating substrate 12, an n-type contact layer 16 formed on the buffer layer 14, an n-type cladding layer 17 formed on a first surface region of the n-type contact layer 16, a multiple quantum well light emitting layer 18 formed on the n-type cladding layer 17, a p-type cladding layer 20 formed on the multiple quantum well light emitting layer 18, a p-type contact layer 22 formed on the p-type cladding layer 20, a dual dopant contact layer 24 formed on the p-type contact layer 22, a transparent conductive oxide layer 26 formed on the dual dopant contact layer 24, a p-type electrode 28 formed on the transparent conductive oxide layer 26, and an n-type electrode 30 formed on a second surface region of the n-type contact layer 16.

The dual dopant contact layer 24 is doped by a p-type impurity and an n-type impurity simultaneously. In the preferred embodiment, the concentration of the impurities is equal to $1*10^{19}$ $cm^{-3}$, and the thickness of the dual dopant contact layer 24 roughly equals 60 angstroms. As the experimental result shown in the following Table 1, the preferred embodiment has a forward bias voltage greater than a forward bias voltage required by a conventional LED utilizing a Ni/Au metallic layer, and the forward bias voltage is raised from 3.15V to 3.16V. Please note that the forward bias voltage is measured when 20 mA current passes through the novel LED 10 and the conventional LED. As shown in Table 1, the preferred embodiment has light intensity greater than light intensity outputted by the conventional LED utilizing the Ni/Au metallic layer, and the light intensity is raised from 25.7 mcd to 34.5 mcd. That is, the light intensity is improved by 34.2%. In addition, the conventional LED with an n+ reverse tunneling contact layer is tested, and the result is shown in Table 1. It is obvious that the conventional LED with the n+ reverse tunneling contact layer is capable of increasing the light intensity, but the required forward bias voltage is accordingly increased. Therefore, the LED 10 according to the present invention can improve the light intensity without greatly increasing the exerted forward bias voltage. Compared with the conventional LED, the LED 10 according to the present invention apparently has better performance.

TABLE 1

|  | Vf(V)@20 mA | Intensity (mcd) |
|---|---|---|
| Ni/Au metallic layer | 3.15 | 25.7 |
| n+ reverse tunneling contact layer | 3.41 | 36.3 |
| novel LED | 3.16 | 34.5 |

Please note that the formation of the dual dopant contact layer 24 is not limited by the above-mentioned manufacturing method. Taking another LED emitting light with a wavelength equaling 526 nm for example, this LED has the same structure shown in FIG. 1, but the dual dopant contact layer 24 for this LED is manufactured by another process. After the p-type contact layer 22 is fabricated, an n-type InGaN contact layer with a thickness equaling 20 angstroms is then stacked on the p-type contact layer 22. After the n-type InGaN contact layer successfully grows on the p-type contact layer 22, an annealing process with a cooling rate less than 40° C./min is applied to make the n-type impurity within the n-type InGaN contact layer and the p-type impurity within the p-type contact layer 22 diffuse to each other. Then, the original n-type InGaN contact layer contains both the n-type impurity and p-type impurity, and the InGaN contact layer becomes a dual dopant contact layer. The dual dopant contact layer then has the concentration of n-type impurity equaling $8*10^{18}$ $cm^{-3}$, and has the concentration of p-type impurity equaling $5*10^{18}$ $cm^{-3}$. The experimental result associated with the above LED is shown in Table 2.

TABLE 2

|  | Vf(V)@20 mA | Intensity (mcd) |
|---|---|---|
| Ni/Au metallic layer | 3.11 | 137.6 |
| N+ reverse tunneling contact layer | 3.56 | 171.6 |
| novel LED | 3.20 | 178.4 |

Compared to the conventional LED with the Ni/Au metallic layer, the novel LED raises the light intensity from 137.6 mcd to 178.4 mcd. That is, the light intensity is then improved by 29.8%. Similarly, the conventional LED with the n+ reverse tunneling contact layer is tested, and the result is also shown in Table 2. It is obvious that the conventional LED with the n+ reverse tunneling contact layer is capable of increasing the light intensity, but the required forward bias voltage is accordingly increased to be 3.56V that is greatly higher than the forward bias voltage (3.11V) required by conventional LED with the Ni/Au metallic layer. However, the forward bias voltage measured for the novel LED is merely raised from 3.11V to 3.20V. Therefore, the LED of to the present invention can improve the light intensity without greatly increasing the exerted forward bias voltage. Compared with the conventional LED, the LED of to the present invention apparently performs better.

Figure 2:
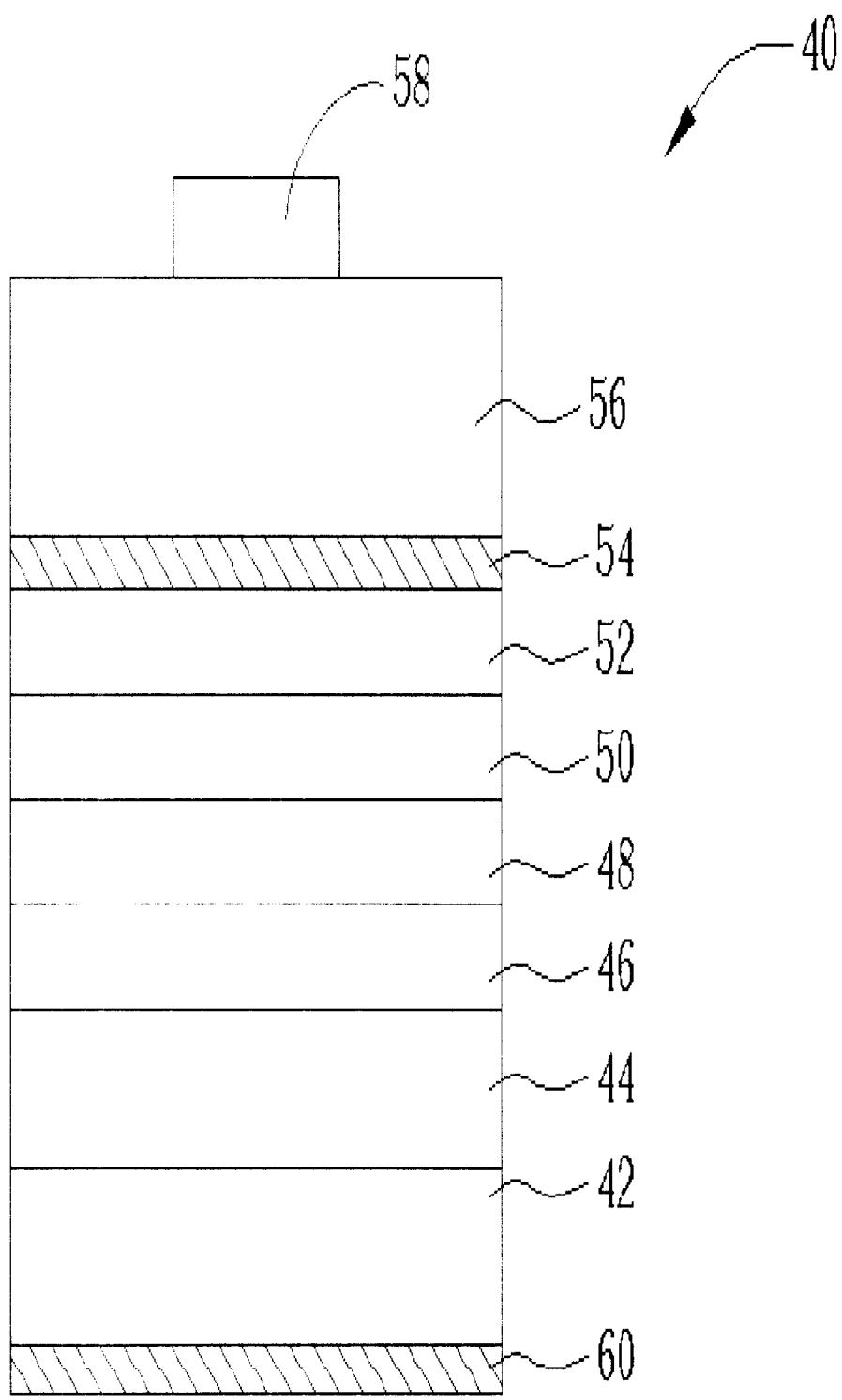
FIG. 2 is a structure diagram illustrating a light emitting diode according to a second embodiment of the present invention.

Please refer to FIG. 2, which is a structure diagram illustrating a light emitting diode 40 according to a second embodiment of the present invention. The structure of the LED 40 is similar to that of the LED 10 shown in FIG. 1. The only difference is that the compound semiconductor layers 44~56 are stacked on one side of an n-type conductive substrate 42 through an epitaxy growth, and an n-type electrode 60 contacts the n-type conductive substrate 42 on another side. Because the substrate 42 itself is conductive, it is unnecessary to perform an etch process after those compound semiconductor layers 44~56 are successfully grown on the n-type conductive substrate 42. Please note that the compound semiconductor layers 44~56 are respectively corresponding to the buffer layer 14, the n-type contact layer 16, the multiple quantum well light emitting layer 18, the p-type cladding layer 20, the p-type contact layer 22, the dual dopant contact layer 24, and the transparent conductive oxide layer 26. In FIG. 2, the layers are the buffer layer 44, the n-type contact layer 46, the multiple quantum well light emitting layer 48, the p-type cladding layer 50, the p-type contact layer 52, the dual dopant contact layer 54, and the transparent conductive oxide layer 56. In addition, a p-type electrode 58 is formed on the transparent conductive oxide layer 56.

The n-type conductive substrate 42 is made of one material selected from a material group consisting of GaN, SiC, Si, AlN, ZnO, MgO, GaP, GaAs, and Ge. The above-mentioned insulating substrate 12 is made of one semiconductor material selected from a material group consisting of sapphire, $LiGaO_2$, and $LiAlO_2$. The above-mentioned buffer layer 14 is made of AlInGaN-based material or II-nitride-based material. The aboved-mentioned p-type contact layer 16 comprises $Al_{x1}In_{y1}Ga_{1-(x1+y1)}N$ ($0 \leq x1 \leq 1; 0 \leq y1 \leq 1;$ and $0 \leq x1+y1 \leq 1$). The aboved-mentioned n-type cladding layer 17 comprises $AlxGa1-xN$, and $0 \leq x \leq 1$. The above-mentioned multiple quantum well light emitting layer 18 comprises r InGaN quantum wells and (r+1) InGaN barriers so that both sides of each InGaN quantum well is sandwiched in between two InGaN barriers. Please note that r is not less than 1, each InGaN quantum well is formed by $In_eGa_{1-e}N$, and each InGaN barrier is formed by $In_fGa_{1-f}N$ ($0 \leq f < e \leq 1$). The above-mentioned p-type cladding layer 20 comprises $Al_yGa_{1-y}N$, wherein $0 \leq y \leq 1$. The aboved-mentioned p-type contact layer 22 being made of $Al_{x2}In_{y2}Ga_{1-(x2+y2)}N$ ($0 \leq x2 \leq 1; 0 \leq y2 \leq 1;$ and $0 \leq x2+y2 \leq 1$). The above-mentioned transparent conductive oxide layer 26 is made of one semiconductor material selected from a material group consisting of Indium-tin oxide (ITO), Cadmium-tin oxide, Antimony-tin oxide (ATO), Zinc oxide (ZnO), and Zinc-tin oxide. The above-mentioned dual dopant contact layer 24 is made of GaN-based material. The above-mentioned n-type dopant is made of one material selected from a material group consisting of Si, Ge, Sn, Te, O, S, and C, and the p-type dopant is made of one material selected from a material group consisting of Mg, Zn, Be, and Ca.

In contrast to the conventional LED, the novel LED positions a dual dopant layer between a transparent conductive oxide layer and the light emitting stacked structure. With the p-type impurity and the n-type impurity coexistent in the dual dopant layer, the resistance associated with the ohmic contact between the transparent conductive oxide layer and the light emitting stacked structure is reduced. Therefore, the novel LED is capable of solving the problem in the conventional LED. Because the dual dopant layer has p-type impurity and n-type impurity, an energy level associated with the n-type impurity and an energy level associated with the p-type impurity coexist within the energy band gap of the dual dopant layer. Therefore, when the novel LED is powered by a forward bias voltage, carriers are conductive through both coexisted impurity energy levels. Hence, conductive carriers are transmitted between the transparent conductive oxide layer and p-type cladding layer for forming a good ohmic contact between the transparent conductive oxide layer and the stacked semiconductor layers of the LED. With this transmission mechanism, it is unnecessary to fabricate a conventional LED of a p-type contact layer with a p-type carrier concentration, as well as a high conductivity. Therefore, the problem related to forming the high carrier concentration p-type contact layer of the conventional LED is solved by the novel LED. In addition, the novel LED is capable of greatly increasing intensity of the emitted light without seriously raising forward bias voltage. To sum up, the overall performance of the novel LED is better than the performance of the conventional LED.

What is claimed is:

1. A nitride based light emitting diode (LED) comprising:
   a substrate;
   a first conductivity contact layer formed over the substrate, the first conductivity contact layer being made of $Al_{x1}In_{y1}Ga_{1-(x1+y1)}N$ ($0 \leq x1 \leq 1; 0 \leq y1 \leq 1;$ and $0 \leq x1+y1 \leq 1$);
   a light emitting layer formed over the first conductivity nitride based contact layer;
   a second conductivity contact layer formed over the light emitting layer, the second conductivity contact layer being made of $Al_{x2}In_{y2}Ga_{1-(x2+y2)}N$ ($0 \leq x2 \leq 1; 0 \leq y2 \leq 1;$ and $0 \leq x2+y2 \leq 1$);
   a nitride based dual dopant contact layer formed over the second conductivity contact layer, the nitride based dual dopant contact layer comprising at least a p-type impurity and an n-type impurity wherein a concentration of the n-type impurity being higher than a concentration of the p-type impurity; and
   a transparent conductive oxide layer formed over the nitride based dual dopant contact layer.

2. The LED of claim 1, wherein the nitride based dual dopant contact layer is formed by: providing a second conductive type contact layer on the light emitting stacked structure; then providing a first conductive type contact layer on the second conductive type contact layer; and then cooling the LED through a cooling rate less than 40°C./min.

3. A nitride based light emitting diode (LED) comprising:
   a substrate;
   a light emitting stacked structure formed over the substrate;
   a nitride based dual dopant contact layer formed over the light emitting stacked structure, the nitride based dual dopant contact layer comprising a p-type impurity and an p-type impurity, wherein the dual dopant contact layer is essentially not p-type; and
   a transparent conductive oxide layer formed over the nitride based dual dopant contact layer.

4. A nitride based light emitting diode (LED) comprising:
   a substrate;
   a light emitting stacked structure formed over the substrate;
   a nitride based dual dopant contact layer formed over the light emitting stacked structure, the nitride based dual dopant contact layer comprising a p-type impurity and an n-type impurity wherein the dual dopant contact layer is essentially not a highly conductive layer; and
   a transparent conductive oxide layer formed over the nitride based dual dopant contact layer.

5. The LED of claim 4 wherein the dual dopant contact layer has a p-type carrier concentration lower than $5 \times 10^{18}$ $cm^{-3}$.

6. The LED of claim 1, wherein the nitride based dual dopant contact layer is made of $Al_aIn_bGa_{1-(a+b)}N$ ($0 \leq a \leq 1; 0 \leq b \leq 1;$ and $0 \leq a+b \leq 1$), the transparent conductive oxide layer is made of indium-tin oxide (ITO), cadmium-tin oxide, antimony-tin oxide (ATO), zinc oxide (ZnO), or zinc-tin oxide.

7. The LED of claim 3, wherein the nitride based dual dopant contact layer is made of $Al_aIn_bGa_{1-(a+b)}N$ ($0 \leq a \leq 1; 0 \leq b \leq 1;$ and $0 \leq a+b \leq 1$), the transparent conductive oxide layer is made of indium-tin oxide (ITO), cadmium-tin oxide, antimony-tin oxide (ATO), zinc oxide (ZnO), or zinc-tin oxide.

8. The LED of claim 4, wherein the nitride based dual dopant contact layer is made of $Al_aIn_bGa_{1-(a+b)}N$ ($0 \leq a \leq 1; 0 \leq b \leq 1;$ and $0 \leq a+b \leq 1$), the transparent conductive oxide layer is made of indium-tin oxide (ITO), cadmium-tin oxide, antimony-tin, oxide (ATO), zinc oxide (ZnO), or zinc-tin oxide.

9. The LED of claim 1, wherein the nitride based dual dopant contact layer is formed by adding the p-type impurity and the n-type impurity together through an epitaxy growth.

10. The LED of claim 3, wherein the nitride based dual dopant contact layer is formed by adding the p-type impurity and the n-type impurity together through an epitaxy growth.

11. The LED of claim 4, wherein the nitride based dual dopant contact layer is formed by adding the p-type impurity and the n-type dopants together through an epitaxy growth.

12. The LED) of claim 1, wherein the light emitting layer has r InGaN quantum wells and (r+1) InGaN barriers, each InGaN quantum well is sandwiched in between two InGaN barriers, each InGaN quantum well is fabricated by $In_eGa_{1-e}$N, and each InGaN barrier is made of $In_fGa_{1-f}$N, $r \leq 1$, and $0 \leq f < e \leq 1$.

13. The LED of claim 3, wherein the light emitting stacked structure comprises a multiple quantum well, the multiple quantum well has r InGaN quantum wells and (r+1) InGaN barriers, each InGaN quantum well is sandwiched in between two InGaN barriers, each InGaN quantum well is fabricated by $In_eGa_{1-e}$N, and each InGaN barrier is made of $In_fGa_{1-f}$N, $r \leq 1$, and $0 \leq f < e \leq 1$.

14. The LED of claim 4, wherein the light emitting stacked structure comprising a multiple quantum well, the multiple quantum well has r InGaN quantum wells and (r+1) InGaN barriers, each InGaN quantum well is sandwiched in between two InGaN barriers, each InGaN quantum well is fabricated by $In_eGa_{1-e}$N, and each InGaN barrier is made of $In_fGa_{1-f}$N, $r \leq 1$, and $0 \leq f < e \leq 1$.

15. The LED of claim 1 further comprising a first conductivity cladding layer interposed between the first conductivity contact layer and the light emitting layer, and the first conductivity cladding layer is made of $Al_xGa_{1-x}$N, and $0 \leq x \leq 1$.

16. The LED of claim 13 further comprising a first conductivity cladding layer interposed between the first conductivity contact layer and the multiple quantum well light emitting layer and the first conductivity cladding layer is made of $Al_xGa_{1-x}$N, and $0 \leq x \leq 1$.

17. The LED of claim 14 further comprising a first conductivity cladding layer interposed between the first conductivity contact layer and the multiple quantum well light emitting layer and the first conductivity cladding layer is made of $Al_xGa_{1-x}$N, and $0 \leq x \leq 1$.

18. The LED of claim 1 further comprising a second conductivity cladding layer interposed between the second conductivity contact layer and the light emitting layer, and the second conductivity cladding layer is made of $Al_zGa_{1-z}$N, and $0 \leq z \leq 1$.

19. The LED of claim 13 further comprising a second conductivity cladding layer interposed between the second conductivity contact layer and the multiple quantum well light emitting layer and the second conductivity cladding layer is made of $Al_zGa_{1-z}$N, and $0 \leq z \leq 1$.

20. The LED of claim 14 further comprising a second conductivity cladding layer interposed between the second conductivity contact layer and the multiple quantum well light emitting layer and the second conductivity cladding layer is made of $Al_zGa_{1-z}$N, and $0 \leq z \leq 1$.

21. The LED of claim 1 wherein the nitride based dual dopant contact layer is made of $Al_aIn_bGa_{1-(a+b)}$N ($0 \leq a \leq 1$; $0 \leq b \leq 1$; and $0 \leq a+b \leq 1$); the n-type impurity is selected from the group consisting of Si, Ge, Sn, Te, O, S, and C; and the p-type impurity is selected from the group consisting of Mg, Zn, Be, and Ca.

22. The LED of claim 3 wherein the nitride based dual dopant contact layer is made of $Al_aIn_bGa_{1-(a+b)}$N ($0 \leq a \leq 1$; $0 \leq b \leq 1$; and $0 \leq a+b \leq 1$); the n-type impurity are made of Si, Ge, Sn, Te, O, S, or C; and the p-type impurity are made of Mg, Zn, Be, or Ca.

23. The LED of claim 4 wherein the nitride based dual dopant contact layer is made of $Al_aIn_bGa_{1-(a+b)}$N ($0 \leq a \leq 1$; $0 \leq b \leq 1$; and $0 \leq a+b \leq 1$); the n-type impurity are made of Si, Ge, Sn, Te, O, S, or C; and the p-type impurity are made of Mg, Zn, Be, or Ca.

24. The LED of claim 1 wherein the dual dopant contact layer has a thickness less than 60 angstroms.

25. The LED of claim 3 wherein the dual dopant contact layer has a thickness less than 60 angstroms.

26. The LED of claim 4 wherein the dual dopant contact layer has a thickness less than 60 angstroms.

* * * * *